(12) United States Patent
Shimokawa et al.

(10) Patent No.: US 7,781,323 B2
(45) Date of Patent: Aug. 24, 2010

(54) SEMICONDUCTOR DEVICE AND MANUFACTURING METHOD THEREOF

(75) Inventors: Kazuo Shimokawa, Yokohama (JP); Akira Ushijima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 254 days.

(21) Appl. No.: 11/277,196

(22) Filed: Mar. 22, 2006

(65) Prior Publication Data

US 2006/0214274 A1     Sep. 28, 2006

(30) Foreign Application Priority Data

Mar. 24, 2005     (JP) .............................. 2005-085855

(51) Int. Cl.
*H01L 21/44* (2006.01)
*H01L 21/48* (2006.01)

(52) U.S. Cl. ........................ 438/612; 438/661; 438/615; 438/108; 257/772; 257/E21.508

(58) Field of Classification Search ................ 438/612, 438/661, 652, 613–615, 108; 257/772, E23.023, 257/E21.508
See application file for complete search history.

(56) References Cited

U.S. PATENT DOCUMENTS

| | | | |
|---|---|---|---|
| 5,640,052 A * | 6/1997 | Tsukamoto | 257/781 |
| 5,985,692 A * | 11/1999 | Poenisch et al. | 438/106 |
| 6,281,040 B1 * | 8/2001 | McCormack et al. | 438/106 |
| 6,998,293 B2 * | 2/2006 | Achari et al. | 438/108 |
| 7,075,183 B2 * | 7/2006 | Soga et al. | 257/772 |
| 7,250,330 B2 * | 7/2007 | Thomas et al. | 438/127 |
| 7,452,750 B2 * | 11/2008 | Lo et al. | 438/108 |
| 2002/0149117 A1 * | 10/2002 | Shibata | 257/777 |
| 2003/0121529 A1 * | 7/2003 | Sachdev et al. | 134/2 |
| 2004/0007384 A1 * | 1/2004 | Soga et al. | 174/260 |
| 2005/0029666 A1 * | 2/2005 | Kurihara et al. | 257/772 |

FOREIGN PATENT DOCUMENTS

| | | |
|---|---|---|
| CN | 1444273 A | 9/2003 |
| JP | 2000-332343 | 11/2000 |
| JP | 2001-510941 | 8/2001 |
| JP | 2001-284696 | 10/2001 |
| JP | 2003-234482 | 8/2003 |

* cited by examiner

*Primary Examiner*—Nitin Parekh
(74) *Attorney, Agent, or Firm*—Oblon, Spivak, McClelland, Maier & Neustadt, L.L.P.

(57) ABSTRACT

In a semiconductor device manufacturing method which includes a mounting a semiconductor element having a bonding electrode on a substrate, the mounting includes supplying solder paste containing Au—Sn series solder particles onto the substrate, putting the semiconductor element having a film of an Sn alloy or Sn formed on the bonding electrode on the solder paste, and melting the Au—Sn series solder particles and the film of the Sn alloy or Sn to bond the semiconductor element to the substrate.

4 Claims, 3 Drawing Sheets

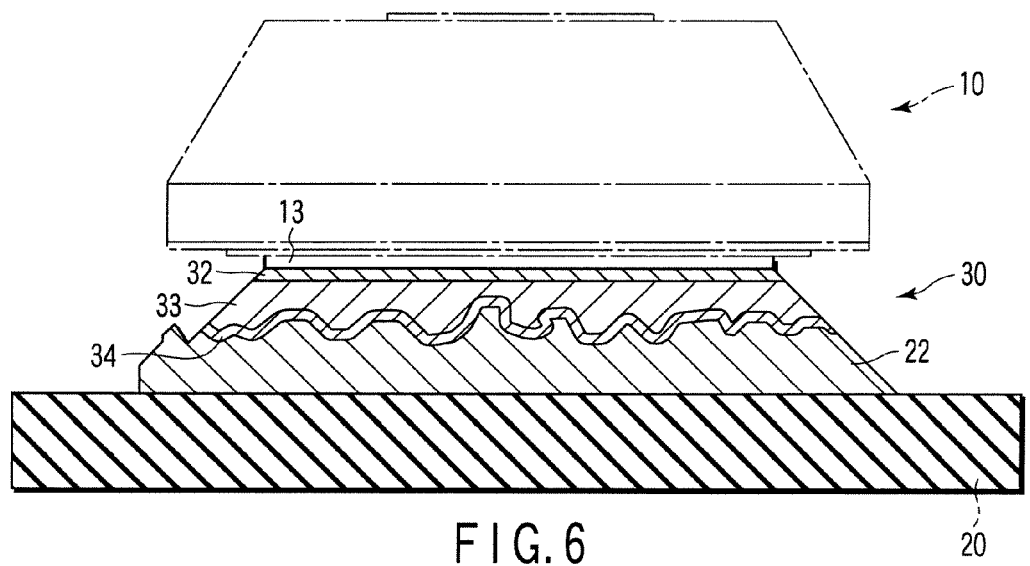
FIG. 6
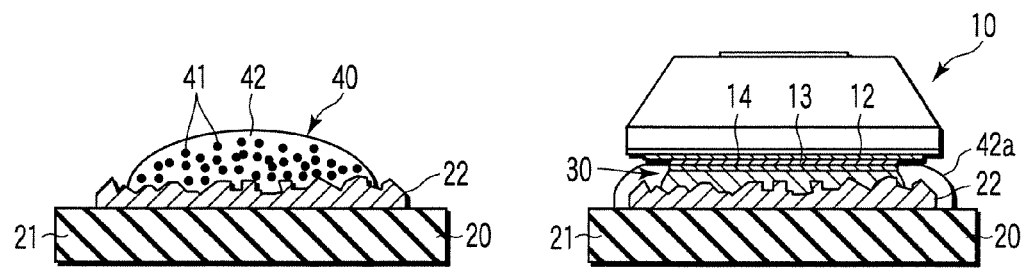
FIG. 7A
FIG. 7B
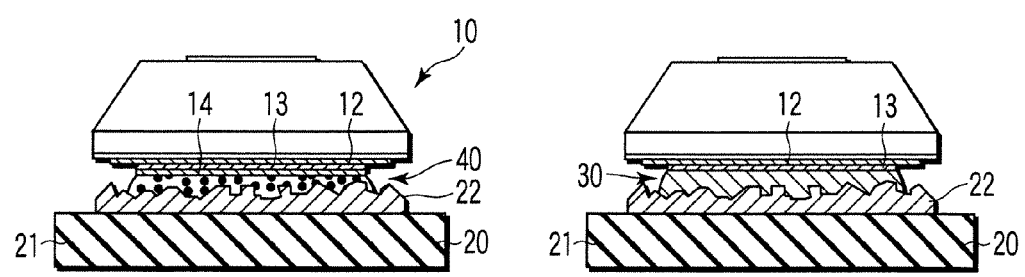
FIG. 7C
FIG. 7D

SEMICONDUCTOR DEVICE AND MANUFACTURING METHOD THEREOF

CROSS-REFERENCE TO RELATED APPLICATIONS

This application is based upon and claims the benefit of priority from prior Japanese Patent Application No. 2005-085855, filed Mar. 24, 2005, the entire contents of which are incorporated herein by reference.

BACKGROUND OF THE INVENTION

1. Field of the Invention

This invention relates to a semiconductor device and a semiconductor device manufacturing method having a mounting process of mounting a semiconductor element on a substrate.

2. Description of the Related Art

Recently, the application field of semiconductor light emitting diodes (LEDs) has increased dramatically with the progress of the process technology associated with gallium-nitride (GaN) series compound semiconductor and the progress of the techniques associated with fluorescent bodies.

Particularly, since a semiconductor light emitting device having a combination of an LED which can emit light of a wavelength range of ultraviolet rays to visible light and a fluorescent body which is suitable for the LED can attain white light which is excellent in the color rendering property, the range of the application thereof to the backlight of the liquid crystal display, button illumination, various lights of cars and the like is further enlarged. In addition, a high-power semiconductor light emitting device used as a light source for a flash lamp, a flash of a camera and the like has been developed.

Recently, new packages which are each configured by mounting a plurality of LED chips in one package as shown in FIG. 10 are commercialized. The package is obtained by die-mounting a plurality of chips 200 on a ceramic substrate 100.

When the LED chips 200 with the junction-down structure are die-mounted on the ceramic substrate 100, the roughness of an electrode surface 101 of the ceramic substrate 100 cannot be compensated for by use of a solder film 102 (for example, refer to Jpn. Pat. Appln. KOKAI Publication No. 2003-234482) with the film thickness of 2 to 3 μm which is conventionally used since the electrode surface 101 of the ceramic substrate 100 is approximately 3 to 7 μm in Rz and rough. Thus, inadequate bonding may occur.

In order to solve the above problem, a method for setting the thickness of the solder film 102 substantially equal to the roughness of the electrode surface 101 of the ceramic substrate 100 is considered. However, since the surface roughness of the ceramic substrate 100 varies, there occurs a problem that molten solder is forced out from a gap between the ceramic substrate and the LED chip and is brought into contact with the side surface of the LED chip when the LED chip 200 is die-mounted on the electrode surface 101 having small variation in the surface roughness.

In order to solve the above problems, as shown in FIG. 12, a mounting method in which the film thickness of a bonding portion is increased by using Au—Sn solder paste 110 as a sub-member is studied. In the mounting method, first, Au—Sn solder paste 110 is supplied to an electrode surface 101 of the ceramic substrate 100. Then, LED chips 200 each having an Au—Sn solder film 102 formed on the bonding electrode are mounted on the Au—Sn solder paste. After this, the ceramic substrate 100 and LED chips 200 are passed through a reflow furnace to melt the solder portion. Since the mounting method is a reflow heating system, the LED chip 200 is lifted due to the surface tension of the solder, and therefore, the solder is prevented from creeping up to the side surface of the LED chip 200.

However, in a solder bonding method of forming an Au—Sn solder film 102 on the die-mount bonding surface of the LED chip 200 and supplying Au—Sn solder paste 110 as a sub-member, there occurs a problem that air bubbles 111 will often occur in the bonding portion.

BRIEF SUMMARY OF THE INVENTION

An object of this invention is to provide a semiconductor device and a semiconductor device manufacturing method capable of preferably bonding a semiconductor element to a substrate.

A semiconductor device manufacturing method and a semiconductor device according to aspects of the present invention are configured as follows.

(1) In a semiconductor device manufacturing method which includes a mounting a semiconductor element having a bonding electrode on a substrate, the mounting comprises supplying solder paste containing Au—Sn series solder particles onto the substrate, putting the semiconductor element having a film of one of an Sn alloy and Sn formed on the bonding electrode on the solder paste, and melting the Au—Sn series solder particles and the film of one of the Sn alloy and Sn to bond the semiconductor element to the substrate.

(2) In a semiconductor device manufacturing method which includes a mounting a semiconductor element having a bonding electrode on a substrate, the mounting comprises supplying solder paste containing Sn-series solder particles onto the substrate, putting the semiconductor element having a film of an Au—Sn alloy formed on the bonding electrode on the solder paste, and melting the Sn-series solder particles and the film of the Au—Sn alloy to bond the semiconductor element to the substrate.

(3) In a semiconductor device manufacturing method which includes a mounting a semiconductor element having a bonding electrode on a substrate, the mounting comprises supplying an Au—Sn series solder sheet and flux onto the substrate, putting the semiconductor element having a film of one of an Sn alloy and Sn formed on the bonding electrode on the solder sheet and flux, and melting the solder sheet and the film of one of the Sn alloy and Sn to bond the semiconductor element to the substrate.

(4) In a semiconductor device manufacturing method which includes a mounting a semiconductor element having a bonding electrode on a substrate, the mounting comprises supplying an Sn-series solder sheet and flux onto the substrate, putting the semiconductor element having a film of an Au—Sn alloy formed on the bonding electrode on the solder sheet and flux, and melting the solder sheet and the film of the Au—Sn alloy to bond the semiconductor element to the substrate.

(5) A semiconductor device comprises a semiconductor element, a substrate on which the semiconductor element is mounted, and a bonding portion interposed between the semiconductor element and the substrate to bond the semiconductor element to the substrate, wherein the bonding portion includes one of an Ni—Sn alloy layer and Ni—Au—Sn alloy layer, an Au—Sn alloy layer having an Sn amount of not less than 22 wt % and an Ni—Sn alloy layer arranged in this order from the semiconductor element side.

According to this invention, in the above semiconductor device, the semiconductor element can be preferably bonded to the substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 6 is a cross-sectional view of a bonding portion in the first embodiment;

FIG. 7A is a cross-sectional view for illustrating a die-mounting step of the LED chip in the first embodiment;

FIG. 7B is a cross-sectional view for illustrating a die-mounting step of the LED chip in the first embodiment;

FIG. 7C is a cross-sectional view for illustrating a die-mounting step of the LED chip in the first embodiment;

FIG. 7D is a cross-sectional view for illustrating a die-mounting step of the LED chip in the first embodiment;

DETAILED DESCRIPTION OF THE INVENTION

There will now be described first and second embodiments of this invention with reference to the accompanying drawings.

FIRST EMBODIMENT

First, the first embodiment is explained with reference to FIGS. 1 to 8.

[Structure of Semiconductor Device]

Figure 1:
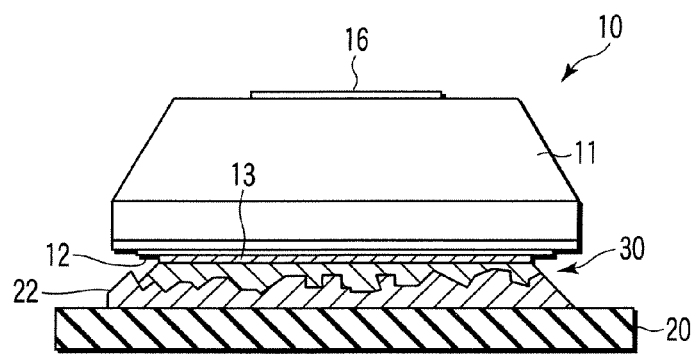
FIG. 1 is a view showing the structure of a semiconductor device having an LED chip with the junction-down structure mounted thereon in a first embodiment of this invention.

FIG. 1 is a view showing the structure of a semiconductor device having an LED chip 10 of the junction-down structure mounted thereon in the first embodiment of this invention.

As shown in FIG. 1, the semiconductor device includes an LED chip (semiconductor element) 10, a ceramic substrate (substrate) 20, and a bonding portion 30 which bonds the LED chip 10 to the ceramic substrate 20.

[Structure of LED Chip 10]

Figure 2:
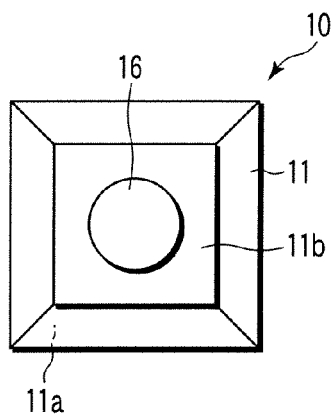
FIG. 2 is a top plan view of the LED chip in the first embodiment.
Figure 3:
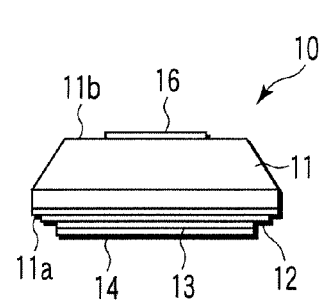
FIG. 3 is a side view of the LED chip in the first embodiment.
Figure 4:
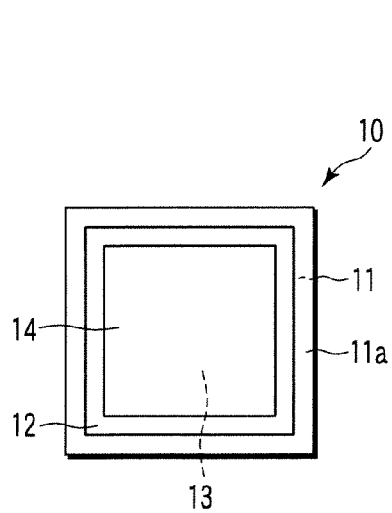
FIG. 4 is a bottom view of the LED chip in the first embodiment.

FIG. 2 is a top plan view of the LED chip 10 in the first embodiment, FIG. 3 is a side view of the LED chip 10 in the first embodiment, and FIG. 4 is a bottom view of the LED chip 10 in the first embodiment.

The LED chip 10 shown in FIGS. 2 to 4 is a chip obtained before it is die-mounted on the ceramic substrate 20 and has a chip main body 11 of substantially a trapezoid primoid form.

The size of the chip main body 11 is as follows. The size of the surface 11a (which is hereinafter referred to as a "die-mount bonding surface") which lies on the ceramic substrate 20 side when the chip main body 11 is die-mounted on the ceramic substrate 20 is approximately 0.3 mm×0.3 mm. The size of the surface 11b (which is hereinafter referred to as a "non-die-mount bonding surface") which lies in opposition to the die-mount bonding surface 11a is approximately 0.2 mm×0.2 mm. The distance between the die-mount bonding surface 11a and the non-die-mount bonding surface is approximately 0.1 mm.

An epitaxial layer 12 used as a light emitting layer is formed on the die-mount bonding surface 11a. The epitaxial layer 12 is deposited on a semiconductor layer (not shown) of the LED chip 10 by epitaxial growth and a die-mount bonding electrode 13 which is to be bonded to the ceramic substrate 20 is formed on the epitaxial layer.

The die-mount bonding electrode 13 has various metals as a base material thereof and an Ni film (not shown) used to enhance the wettability of solder (which will be described later) is formed on the surface of the bonding electrode.

The size of the die-mount bonding electrode 13 is smaller than that of the die-mount bonding surface 11a. Therefore, the die-mount bonding electrode 13 is arranged inside an area defined by the outer edge of the die-mount bonding surface 11a. In the present embodiment, the die-mount bonding surface 11a is set to approximately 0.3 mm×0.3 mm and the die-mount bonding electrode 13 is set to approximately 0.2 mm×0.2 mm.

An Sn film (a film formed of an Sn alloy or Sn) 14 used to bond the die-mount bonding electrode 13 to wires 22 (which will be described later) of the ceramic substrate 20 is formed on the surface of the Ni film. The thickness of the Sn film 14 is approximately 2.0 μm.

As a material of the Sn film 14, it is preferable to use a simple substance of Sn which contains less impurity, but this is not limitative. A material such as an Sn—Cu alloy or Sn—Zn alloy can be used if it is a material which contains Sn and is melted at solder bonding temperature.

Further, a passivation film (not shown) which prevents creeping-up of solder is formed around the die-mount bonding electrode 13. As a material of the passivation film, resin such as polyimide is used.

A non-die-mount bonding electrode 16 which is wire-bonded to the ceramic substrate 20 is formed on the non-die-mount bonding surface 11b. The non-die-mount bonding electrode 16 is formed in a circular form and the diameter thereof is approximately 0.1 mm.

[Structure of Ceramic Substrate 20]

Figure 5:
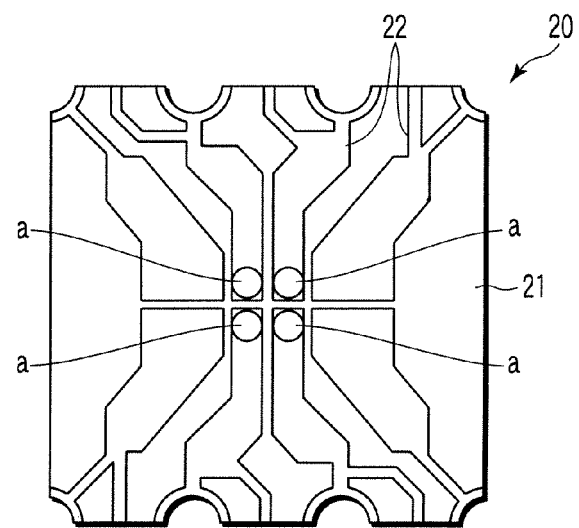
FIG. 5 is a plan view of a ceramic substrate in the first embodiment.

FIG. 5 is a plan view of the ceramic substrate 20 in the first embodiment.

As shown in FIG. 5, the ceramic substrate 20 is formed of a base member 21 and wires 22. The base member 21 contains alumina as a material thereof and the size thereof is approximately 5.0 mm×5.0 mm×0.3 mm.

The wire 22 contains tungsten as a material thereof and an Ni film (not shown) used to enhance the wettability of solder is formed on the surface of the wires. The thickness of the Ni film is approximately 5.0 µm.

The width of the wire 22 is different depending on portions of the base member 21 and is set larger in a portion "a" on which the LED chip 10 is die-mounted than the die-mount bonding surface 11a of the LED chip 10. In the present embodiment, the size of the die-mount bonding surface 11a is set to approximately 0.3 mm×0.3 mm and the width of the wire 22 is set to approximately 0.4 mm.

An Au film (not shown) which prevents oxidation of the Ni film is formed on the surface of the Ni film. The thickness of the Au film is approximately 0.5 µm. As a manufacturing method of the Ni film and Au film, an electrolytic plating method or the like is used.

Since the ceramic substrate 20 is formed by baking, the surface of the wire 22 is rough and the surface roughness is set to approximately 3.0 µm to 7.0 µm in Rz.

[Structure of Bonding Portion 30]

FIG. 6 is a cross-sectional view of the bonding portion 30 in the first embodiment.

As shown in FIG. 6, the bonding portion 30 has an Ni—Sn alloy layer or Ni—Au—Sn alloy layer 32, Au—Sn alloy layer 33 and Ni—Sn alloy layer 34 arranged in this order from the LED chip 10 side.

The Ni—Sn alloy layer or Ni—Au—Sn alloy layer 32 is an alloy layer formed of Ni contained in an Ni film (not shown) formed on the die-mount bonding electrode 13 and Sn contained in the Sn film 14 formed on the die-mount bonding electrode 13 and Au—Sn eutectic solder particles 41 of solder paste 40 (which will be described later).

The Au—Sn alloy layer 33 is a layer which is formed by melting and solidifying Sn contained in the Au—Sn eutectic solder particles 41 of the solder paste 40 and Sn contained in the Sn film 14 formed on the die-mount bonding electrode 13. The Sn amount of the Au—Sn eutectic solder particles 41 is 20 w % (which will be described later), but the Sn amount of the Au—Sn alloy layer 33 becomes 22 wt % or more due to the presence of the Sn film 14.

The Ni—Sn alloy layer 34 is an alloy layer of Ni contained in an Ni film (not shown) formed on the ceramic substrate 20 and Sn contained in the Au—Sn eutectic solder particles 41 of the solder paste 40.

It should be noted here that at least part of the Ni—Sn alloy layer or Ni—Au—Sn alloy layer 32 is formed of Ni of an Ni film formed on the die-mount bonding electrode 13 and Sn contained in the Sn film 14 formed on the die-mount bonding electrode 13.

[Die-Mounting Process of LED Chip 10]

FIGS. 7A to 7D are cross-sectional views showing a die-mounting process of the LED chip 10 in the first embodiment.

First, as shown in FIG. 7A, solder paste 40 as a sub-member is supplied from a dispenser onto wires 22 of the ceramic substrate 20.

As the solder paste 40, a mixture of Au—Sn eutectic solder particles (Au—Sn series solder particles) 41 and flux 41 is used. The composition ratio of the Au—Sn eutectic solder particles 41 is 80 wt % of Au and 20 wt % of Sn and the melting point thereof is 280° C. The size of the Au—Sn eutectic solder particles 41 is 20 µm or less.

In the solder paste 40 of the present embodiment, the Au—Sn eutectic solder particles 41 are used, but a material is not particularly limited thereto if it is an Au—Sn alloy. Further, a material containing a different element added to the Au—Sn alloy can be used.

The supply form of the solder paste 40 is a conical form and the size thereof is smaller than the die-mount bonding electrode 13 of the LED chip 10. In the present embodiment, the size of the die-mount bonding electrode 13 is 2.0 mm×2.0 mm and the diameter and height of the solder paste 40 are respectively set to 0.25 mm and 0.05 mm.

The supply form of the solder paste can be attained by using a highly precise needle with an inner diameter of 0.15 µm manufactured by MUSASHI engineering Inc. and using a dispenser on the market to apply a pressure of 1.0 kgf for 0.05 seconds.

Next, as shown in FIG. 7B, an LED chip 10 is mounted on the solder paste 40. For mounting of the LED chip 10, a die mounter on the market is used.

Next, as shown in FIG. 7C, a sample having the ceramic substrate 20 and the LED chip 10 mounted on the solder paste 40 of the ceramic substrate 20 is passed through a reflow furnace to melt and solidify the Au—Sn eutectic solder particles 41 of the solder paste 40 and the Sn film 14 of the LED chip 10.

Figure 8:
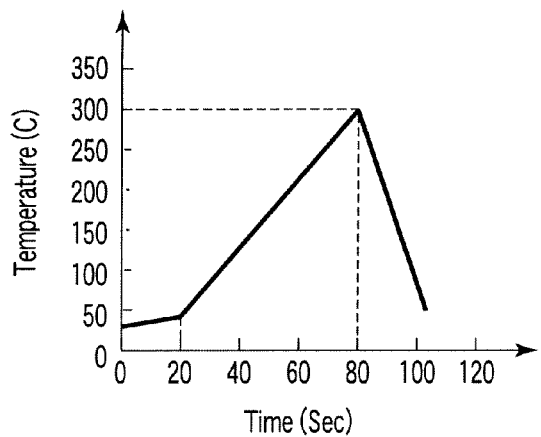
FIG. 8 is a graph showing a reflow temperature profile in the first embodiment.

FIG. 8 is a graph showing a reflow temperature profile in the first embodiment.

As shown in FIG. 8, the temperature of the internal portion of the reflow furnace is raised from the room temperature to 300° C. at a constant rate for 60 seconds, kept at the temperature for two to three seconds and then lowered to the room temperature again.

During the reflow period, Sn contained in the Sn film 14 and Sn contained in the solder paste 40 are diffused to the Ni film side in a portion near the Ni film of the die-mount bonding electrode 13 and the materials are mixed together to form the Ni—Sn alloy layer or Ni—Au—Sn alloy layer 32. Further, in a portion near the Ni film of the ceramic substrate 20, Sn contained in the solder paste 40 is diffused to the Ni film side and the materials are mixed together to form the Ni—Sn alloy layer 34. In an intermediate portion between the die-mount bonding electrode 13 and the wire 22, the Au—Sn eutectic solder particles 41 of the solder paste 40 and the Sn film 14 formed on the die-mount bonding electrode 13 are melted and solidified to form the Au—Sn alloy layer 33.

Thus, the bonding portion 30 formed of the Ni—Sn alloy layer or Ni—Au—Sn alloy layer 32, the Au—Sn alloy layer 33 in which the Sn amount is 22 wt % or more and the Ni—Sn alloy layer 34 is formed between the LED chip 10 and the ceramic substrate 20.

In order to prevent re-oxidation of the solder paste 40, the oxygen concentration in the reflow furnace is set to 500 ppm or lower.

Next, as shown in FIG. 7D, flux residue 42a which is a residual substance of the flux 42 is washed. In the washing process of the flux residue 42a, for example, a sample is dipped into isopropyl alcohol and ultrasonic waves of 38 kHz are applied to the sample for approximately 15 minutes. Thus, the die-mounting process of the LED chip 10 is terminated.

The important thing in the die-mounting process is that at least part of the Ni—Sn alloy layer or Ni—Au—Sn alloy layer 32 is formed of Ni contained in the Ni film of the die-mount bonding electrode 13 and Sn contained in the Sn film 14. In other words, Sn of the Sn film 14 is used for formation of the Ni—Sn alloy layer or Ni—Au—Sn alloy layer 32.

In the conventional semiconductor device, an Ni—Sn alloy layer is formed in an area of the bonding portion 30 which lies on the LED chip 10 side. However, the Ni—Sn alloy layer is formed of Ni contained in the Ni film of the die-mount bonding electrode 13 and Sn contained in the solder paste 40.

Therefore, if the Ni—Sn alloy layer is formed, the percentage of Sn in the solder paste 40 is lowered and the solidifying point of the solder paste is raised. If the solidifying point is raised, the solder paste which can be provided in a liquid form in the state of 80 wt % of Au and 20 wt % of Sn cannot be provided in a liquid form and is solidified.

As a result, the solder is solidified before air bubbles formed in the solder paste are extracted and air bubbles may remain in the bonding portion of a completed semiconductor device in some cases. If air bubbles remain in the bonding portion, the heat exhaust efficiency of the LED chip 10 may be lowered and cracks occurring in the bonding portion may develop.

However, in the present embodiment, Sn in the Sn film 14 is melted and diffused into a solder material at the solder bonding time. At this time, gas caused by a solvent component of the solder paste 40 tends to be transferred to the external portion of the solder paste 40 according to a phase change in the surface portion of the die-mount bonding electrode 13. Therefore, the gas is extracted until an alloy of a molten material of the Sn film 14, that is, Sn and the solder paste 40 is solidified to form the bonding member, and as a result, it is difficult for air bubbles to remain in the bonding portion 30.

OPERATION OF PRESENT EMBODIMENT

In the present embodiment, the Sn film 14 is formed on the die-mount bonding electrode 13 of the LED chip 10. The die-mount electrode 13 is bonded to the wires 22 of the ceramic substrate 20 by use of the Sn film 14 and solder paste 40.

Therefore, since Sn of the Sn film 14 is used to form the Ni—Sn alloy layer or Ni—Au—Sn alloy layer 32, Sn in the Au—Sn alloy layer can be prevented from being diffused into the Ni film of the die-mount bonding electrode 13. Further, the wettability of solder on the die-mount bonding electrode 13 can be enhanced by first melting the Sn film 14. Since the solidification is slowed down while Sn is being diffused, air bubbles can be easily extracted. Therefore, a semiconductor device with high reliability in which almost no air bubbles exist in the bonding portion 30 can be attained.

SECOND EMBODIMENT

Next, a second embodiment of this invention is explained with reference to FIG. 9.

[Die-Mounting Process of LED Chip 10]

Figure 9:
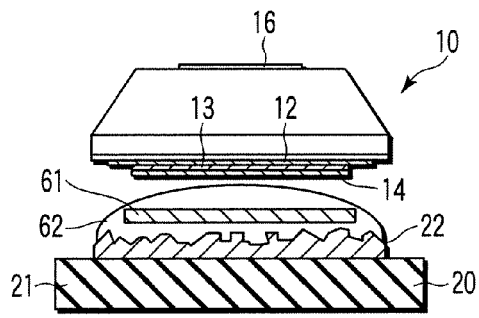
FIG. 9 is a cross-sectional view for illustrating a die-mounting step of an LED chip in a second embodiment of this invention.
Figure 10:
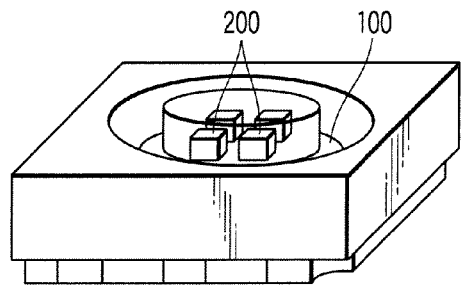
FIG. 10 is a perspective view showing a semiconductor device of a new package configured by mounting a plurality of conventional LED chips in one package.
Figure 11:
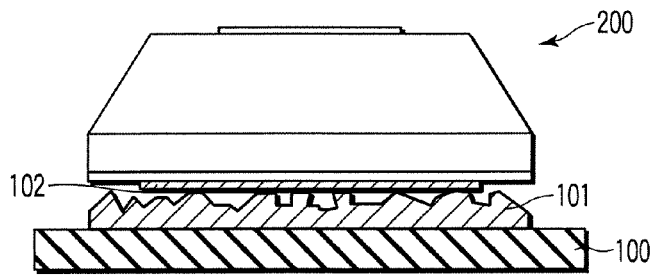
FIG. 11 is a view showing the structure of the conventional semiconductor device using a ceramic substrate whose electrode surface is rough.
Figure 12:
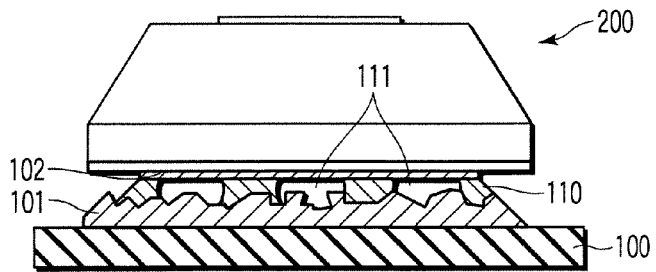
FIG. 12 is a view showing the structure of the conventional semiconductor device in which air bubbles are formed in the bonding portion.

FIG. 9 is a cross-sectional view showing a die-mounting process of an LED chip 10 in a second embodiment of this invention.

As shown in FIG. 9, in the present embodiment, an Au—Sn solder sheet (Au—Sn series solder sheet) 61 and flux 62 as a sub-member are used instead of the solder paste 40. The size of the Au—Sn solder sheet 61 is substantially the same as that of a die-mount bonding electrode 13 and the thickness thereof is 10 μm.

In the die-mounting step of the LED chip 10, the Au—Sn solder sheet 61 is placed on a wire 22 of a ceramic substrate 22, the flux 62 is dropped on the solder sheet and then the LED chip 10 is mounted on the resultant structure. In this case, the reflow and washing processes are the same as those of the first embodiment, and therefore, the explanation thereof is omitted.

OPERATION OF PRESENT EMBODIMENT

Even if the Au—Sn solder sheet 61 and flux 62 are used instead of the solder paste 40, the effect equivalent to that of the first embodiment can be attained. The other effects are the same as those of the first embodiment, and therefore, the explanation thereof is omitted.

In the first and second embodiments, the Sn film 14 is formed on the LED chip 10 side and the Au—Sn solder sheet 61 or Au—Sn eutectic solder particles 41 are used on the sub-member side. However, this invention is not limited to this case. For example, an Au—Sn series eutectic solder film can be formed on the LED chip 10 side and an Sn solder sheet or Sn solder particles can be used on the sub-member side.

Further, in the first and second embodiments, the Sn film 14 is formed on the LED chip 10 side. However, this invention is not limited to this case. For example, a film of an Sn alloy or Sn can be formed on the wire 22 of the ceramic substrate 20. In this case, Sn contained in the Sn alloy film or Sn film formed on the wire 22 of the ceramic substrate 20 is used to form the Ni—Sn alloy layer 34.

In the first and second embodiments, the sizes of the LED chip 10, ceramic substrate 20 and the like are concretely defined by use of numeric values. However, this invention is not limited to this case. That is, the numeric values defined in the first and second embodiments are indicated only as one example.

Further, in the first and second embodiments, the ceramic substrate 20 is used as a substrate. However, this invention is not limited to this case. For example, a metal frame such as a copper frame can be used. Likewise, in the first and second embodiments, the LED chip 10 is used as a semiconductor element. However, this invention is not limited to this case and can be applied to any type of semiconductor element which has an electrode or electrodes formed on the die-mount bonding surface.

This invention is not limited to the above embodiments as they are and can be embodied by modifying the constituents without departing from the technical scope thereof. Further, various inventions can be made by adequately combining a plurality of constituents. For example, some of the constituents can be omitted from all of the constituents disclosed in the above embodiments. In addition, the constituents disclosed in the different embodiments can be adequately combined.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. In a semiconductor device manufacturing method which includes mounting a semiconductor element on a substrate, the mounting comprising:

supplying solder paste including Au-Sn series solder particles and flux onto a Ni film formed on a surface of a wiring provided on the substrate, putting the semiconductor element having a bonding electrode on the solder paste, the bonding electrode comprising a surface on which a Ni film is formed, the Ni film formed on the surface of the bonding electrode being coated with a film of one of an Sn alloy or Sn, melting the Ni film formed on the surface of the wiring, the Ni film formed on the surface of the bonding electrode, the Au-Sn series solder particles and the film of one of the Sn alloy and Sn at a reflow temperature of 280-320 deg. C. for 5 seconds or less, solidifying the melted Ni films, the melted Au-Sn series solder particles, and the melted film of one of the Sn alloy and Sn to form a plurality of alloy layers including an alloy layer which is formed from the Ni film formed on the surface of the bonding electrode and the film of one of the Sn alloy and Sn, or an alloy layer which is formed from the Ni film formed on the surface of the bonding electrode, the Au-Sn series solder particles, and the film of one of the Sn alloy and Sn, said plurality of alloy layers serving as a bonding portion which bonds the substrate to the semiconductor element, and cleaning the bonding portion to eliminate the flux.

2. In the semiconductor device manufacturing method of claim 1, the solder paste consists of Au-Sn series solder particles and flux.

3. In a semiconductor device manufacturing method which includes mounting a semiconductor element on a substrate, the mounting comprising:

supplying solder paste including Sn-series solder particles and flux onto a Ni film formed on a surface of a wiring provided on the substrate, putting the semiconductor element having a bonding electrode on the solder paste, the bonding electrode comprising a surface on which a Ni film is formed, the Ni film formed on the surface of the bonding electrode being coated with a film of Au-Sn alloy, melting the Ni film formed on the surface of the wiring, the Ni film formed on the surface of the bonding electrode, the Sn-series solder particles, and the film of the Au-Sn alloy at a reflow temperature of 280-320 deg. C for 5 seconds or less, solidifying the melted films, the melted Sn series solder particles, and the melted film of the Au-Sn alloy to form a plurality of alloy layers including an alloy layer which is formed from the Ni film formed on the surface of the bonding electrode and the Sn series solder particles, or an alloy layer which is formed from the Ni film formed on the surface of the bonding electrode, the Sn series solder particles, and the film of the Au-Sn alloy, said plurality of alloy layers serving as a bonding portion which bonds the substrate to the semiconductor element, and cleaning the bonding portion to eliminate the flux.

4. In the semiconductor device manufacturing method of claim 3, the solder paste consists of Au-Sn series solder particles and flux.

* * * * *